United States Patent
Huang et al.

(10) Patent No.: US 9,741,852 B2
(45) Date of Patent: Aug. 22, 2017

(54) MANUFACTURING METHOD OF SEMICONDUCTOR STRUCTURE

(71) Applicant: UNITED MICROELECTRONICS CORP., Hsinchu (TW)

(72) Inventors: Shih-Hsien Huang, Kaohsiung (TW); Tsang-Hsuan Wang, Kaohsiung (TW); James Tsai, Tainan (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 14/818,487

(22) Filed: Aug. 5, 2015

(65) Prior Publication Data

US 2017/0040454 A1 Feb. 9, 2017

(51) Int. Cl.
*H01L 29/78* (2006.01)
*H01L 29/08* (2006.01)
*H01L 29/161* (2006.01)
*H01L 29/165* (2006.01)
*H01L 29/24* (2006.01)
*H01L 29/66* (2006.01)

(52) U.S. Cl.
CPC ...... *H01L 29/7848* (2013.01); *H01L 29/0847* (2013.01); *H01L 29/161* (2013.01); *H01L 29/165* (2013.01); *H01L 29/24* (2013.01); *H01L 29/66636* (2013.01)

(58) Field of Classification Search
CPC . H01L 21/22; H01L 21/2205; H01L 21/2053; H01L 21/2033; H01L 21/2018; H01L 21/36; H01L 29/66636; H01L 29/165; H01L 29/66545; H01L 21/02381; H01L 21/30604; H01L 29/7848; H01L 29/9847; H01L 29/24; H01L 29/161
See application file for complete search history.

(56) References Cited

U.S. PATENT DOCUMENTS

| | | | |
|---|---|---|---|
| 8,476,169 B2 | 7/2013 | Yang et al. | |
| 2003/0036268 A1* | 2/2003 | Brabant | C23C 16/0209 438/689 |
| 2006/0057810 A1* | 3/2006 | Smith | H01L 21/02381 438/300 |
| 2007/0108290 A1* | 5/2007 | Kikuchi | G06K 7/10732 235/462.41 |
| 2007/0287272 A1* | 12/2007 | Bauer | H01L 21/02529 438/485 |
| 2009/0108290 A1* | 4/2009 | Yu | H01L 21/823807 257/190 |
| 2012/0015503 A1* | 1/2012 | Yao | H01L 21/26506 438/478 |
| 2013/0040440 A1 | 2/2013 | Adam et al. | |
| 2013/0095627 A1* | 4/2013 | Flachowsky | H01L 21/823807 438/285 |

(Continued)

*Primary Examiner* — Caridad Everhart
(74) *Attorney, Agent, or Firm* — WPAT, PC

(57) ABSTRACT

A manufacturing method of a semiconductor structure is provided. The manufacturing method of the semiconductor structure includes the following steps: providing a substrate; forming a gate structure on the substrate; forming a recess in the substrate at a lateral side of the gate structure; performing a pre-bake process at a temperature of 740-840° C. and under a pressure of equal to or higher than 150 torr; and forming an epitaxial buffer layer in the recess.

9 Claims, 3 Drawing Sheets

(56) References Cited

U.S. PATENT DOCUMENTS

| | | | | |
|---|---|---|---|---|
| 2014/0087535 A1* | 3/2014 | Roh | ................ | H01L 21/823412 438/285 |
| 2014/0308821 A1* | 10/2014 | Ando | ................ | H01L 21/02181 438/778 |
| 2016/0190249 A1* | 6/2016 | Hsieh | ................ | H01L 29/0847 257/51 |

* cited by examiner

MANUFACTURING METHOD OF SEMICONDUCTOR STRUCTURE

BACKGROUND

Technical Field

The disclosure relates in general to a manufacturing method of a semiconductor structure, and more particularly to a manufacturing method of a semiconductor structure having a low-defective epitaxial buffer layer.

Description of the Related Art

With the development of variety types of semiconductor devices, epitaxial growth technology has been widely used in manufacturing semiconductor devices.

In order to provide excellent performance of a semiconductor device, it is crucial to form an epitaxial layer with desired crystalline orientation on the substrate of the semiconductor device. Accordingly, treatments to the surface where the epitaxial layer is deposited have been studied and improved by the industry.

SUMMARY OF THE INVENTION

The disclosure is directed to a manufacturing method of a semiconductor structure. According to the embodiments of the present disclosure, native oxides on the deposition surface of the recess can be effectively removed by the pre-bake process with the specific processing window of a temperature of about 740-840° C. and a pressure of equal to or higher than 150 torr, such that a low-defective epitaxial buffer layer can be formed in the recess, and thus the performance of the semiconductor structure can be improved.

According to an embodiment of the present disclosure, a manufacturing method of a semiconductor structure is disclosed. The manufacturing method of the semiconductor structure includes the following steps: providing a substrate; forming a gate structure on the substrate; forming a recess in the substrate at a lateral side of the gate structure; performing a pre-bake process at a temperature of 740-840° C. and under a pressure of equal to or higher than 150 torr; and forming an epitaxial buffer layer in the recess.

The disclosure will become apparent from the following detailed description of the preferred but non-limiting embodiments. The following description is made with reference to the accompanying drawings.

DETAILED DESCRIPTION OF THE INVENTION

Figure 1:
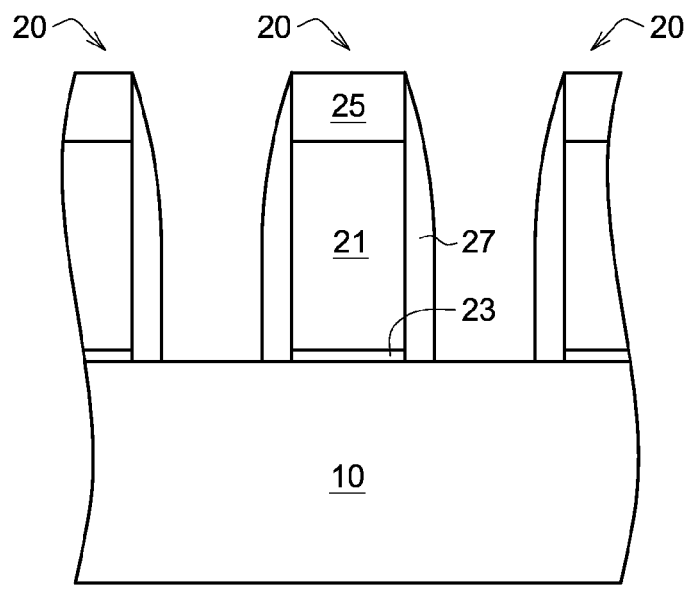
FIGS. 1-4 illustrate a manufacturing method of a semiconductor structure according to an embodiment of the present disclosure.

According to the embodiments of the present disclosure, native oxides on the deposition surface of the recess can be effectively removed by the pre-bake process with the specific processing window of a temperature of about 740-840° C. and a pressure of equal to or higher than 150 torr, such that a low-defective epitaxial buffer layer can be formed in the recess, and thus the performance of the semiconductor structure can be improved. The identical or similar elements of the embodiments are designated with the same reference numerals. It is to be noted that the drawings are simplified for clearly describing the embodiments, and the details of the structure(s) of the embodiment(s) are for exemplification only, not for limiting the scope of protection of the disclosure. Ones having ordinary skills in the art may modify or change the structure(s) according to the embodiments of the present disclosure.

FIGS. 1-4 illustrate a manufacturing method of a semiconductor structure according to an embodiment of the present disclosure. Referring to FIG. 1, a substrate 10 is provided, and a gate structure 20 is formed on the substrate 10. In the embodiment, the substrate 10 may be a semiconductor substrate including but not limited to a silicon substrate or a SOI substrate. In the embodiment, as shown in FIG. 1, a plurality of the gate structures 20 may be formed on the substrate 10.

Referring to FIG. 1, in the embodiment, the step of forming the gate structure 20 may include forming a gate conductive layer 21 on the substrate 10, forming a gate dielectric layer 23 between the substrate 10 and the gate conductive layer 21, and forming a spacer 27 on sidewalls around the gate conductive layer 21. In the embodiment, the gate conductive layer 21 may be formed of polysilicon, and the spacer 27 may be formed of silicon carbon nitride, silicon nitride, or a combination thereof. Optionally, the step of forming the gate structure 20 may further include forming a cap layer 25 on the gate conductive layer 21. The cap layer 25 may be a hard mask layer.

Figure 2:
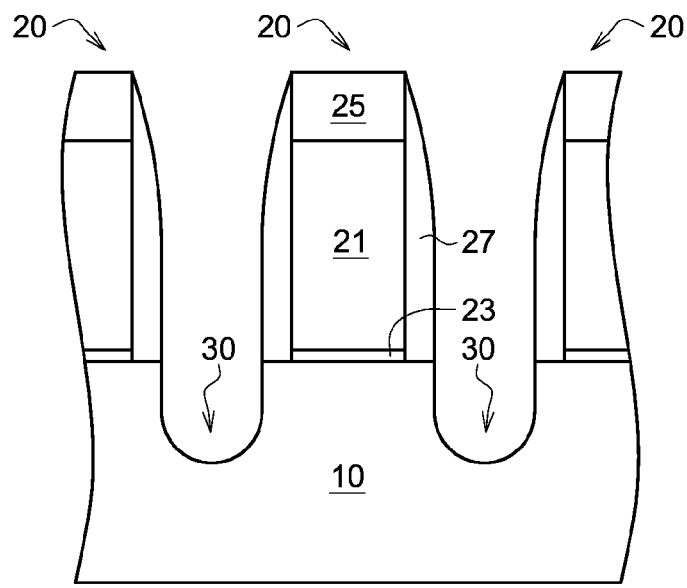

Referring to FIG. 2, a recess 30 is formed in the substrate 10 at a lateral side of the gate structure 20. The recess 30 is formed by such as an etching process. In the embodiment, as shown in FIG. 2, a plurality of the recesses 30 may be formed at lateral sides of the gate structures 20.

After the recess 30 is formed, a pre-bake process is performed at a temperature of 740-840° C. and under a pressure of equal to or higher than 150 torr. Particularly, the pre-bake process is performed on a deposition surface of the recess 30. As the recess 30 is formed, due to the etching process for forming the recess 30 in the substrate 10, native oxides may form and remain on the etched surface of the recess 30. The native oxides remained on the surface of the recess 30 may influence the epitaxial growth(s) of any following layer(s) to be formed thereon in the following steps. According to the embodiments of the present disclosure, the native oxides on the deposition surface of the recess can be effectively removed by the pre-bake process with the specific processing window of a temperature of about 740-840° C. and a pressure of equal to or higher than 150 torr, such that a low-defective epitaxial buffer layer can be formed in the recess, and thus the performance of the semiconductor structure can be improved.

In an embodiment, the pre-bake process may be performed under a pressure of about 200-600 torr. In an embodiment, the pre-bake process may be performed for about 30-300 seconds. In an embodiment, the pre-bake process may be performed with a pure hydrogen ($H_2$) atmosphere.

In some embodiments, the manufacturing method of the present disclosure may further include chemically cleaning the deposition surface of the recess 30 before performing the pre-bake process. In some embodiments, chemically cleaning the deposition surface of the recess 30 may include one or more cleaning steps.

In some embodiments, chemically cleaning the deposition surface of the recess 30 may include treating the deposition surface of the recess 30 with a first etching solution, and the first etching solution includes a mixture of sulfonic acid ($H_2SO_4$) and hydrogen peroxide ($H_2O_2$).

In some embodiments, chemically cleaning the deposition surface of the recess 30 may further include treating the deposition surface of the recess 30 with a second etching solution, and the second etching solution includes a mixture of ammonium hydroxide ($NH_4OH$), hydrogen peroxide ($H_2O_2$), and water ($H_2O$). In the embodiment, the deposition surface of the recess 30 is treated with the first etching solution followed by the second etching solution.

In some embodiments, chemically cleaning the deposition surface of the recess 30 may further include treating the deposition surface of the recess 30 with an etching gas, and the etching gas includes a mixture of ammonia ($NH_3$) and nitrogen trifluoride ($NF_3$). After the treatment of the etching gas, the deposition surface of the recess 30 is etched by less than 20 Å. In the embodiment, the deposition surface of the recess 30 is treated with the etching gas after the treatments of the first etching solution and the second etching solution.

In the embodiment, despite the deposition surface of the recess 30 may be treated with the first etching solution, the second etching solution, and/or the etching gas, chemically cleaning the deposition surface of the recess 30 is free from treating the deposition surface of the recess 30 with hydrofluoric (HF) acid. That is, in the whole chemical cleaning process, the deposition surface of the recess 30 is not treated with hydrofluoric (HF) acid. According to the embodiments of the present disclosure, the native oxides on the deposition surface of the recess can be effectively removed by the pre-bake process with the disclosed specific processing window without chemically cleaning the deposition surface by hydrofluoric (HF) acid etching, and thus the manufacturing steps can be simplified. In addition, without applying hydrofluoric (HF) acid in the recess 30 of the substrate 10, particularly on the deposition surface of the recess 30, any possible damage that may be caused by hydrofluoric (HF) acid to the semiconductor structure can be effectively prevented, and the morphology of the recess 30 as well as the gate structure 20 can remain intact.

Figure 3:
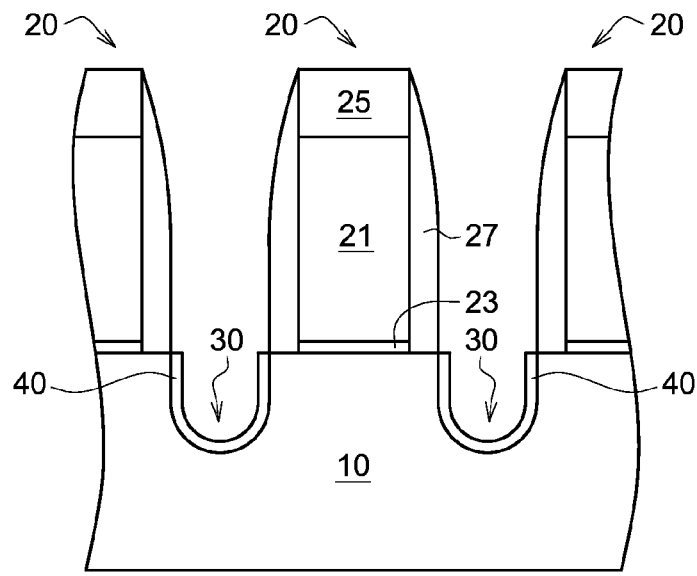

Referring to FIG. 3, an epitaxial buffer layer 40 is formed in the recess 30. In the embodiment, the epitaxial buffer layer 40 is formed on the deposition surface of the recess 30 after the deposition surface is chemically cleaned.

In the embodiment, the epitaxial buffer layer 40 may be formed of SiP or SiGe. In the embodiment, the epitaxial buffer layer 40 may have a thickness of about 70-80 Å. In the embodiment, as shown in FIG. 3, the epitaxial buffer layer 40 is formed on and conformal with the surface of the recess 30.

Figure 4:
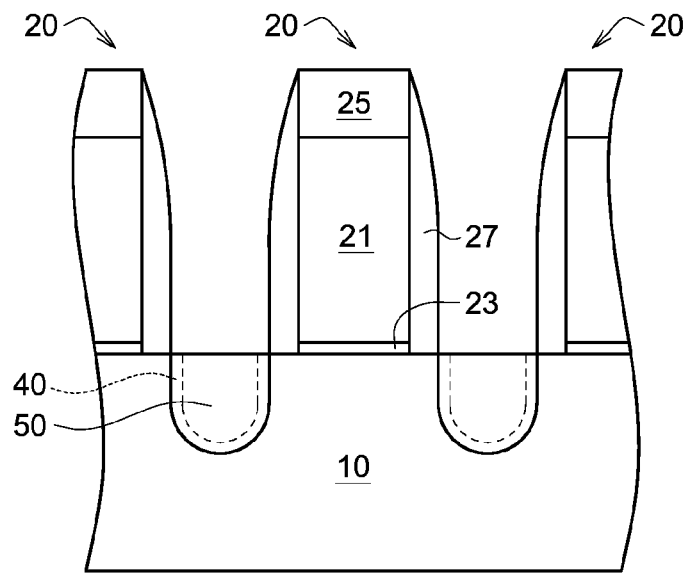

Referring to FIG. 4, an epitaxial layer 50 is formed on the epitaxial buffer layer 40 for filling up the recess 30. As such, the semiconductor structure is formed according to the manufacturing method of the present disclosure.

Further explanation is provided with the following examples. The influences of temperature and pressure in the pre-bake process on the defective percentage of the epitaxial buffer layer 40 formed in the recess 30 of the present disclosure are presented for showing the special effects provided by the manufacturing method according to the embodiments of the disclosure. However, the following examples are for purposes of describing particular embodiments only, and are not intended to be limiting.

Figure 5:
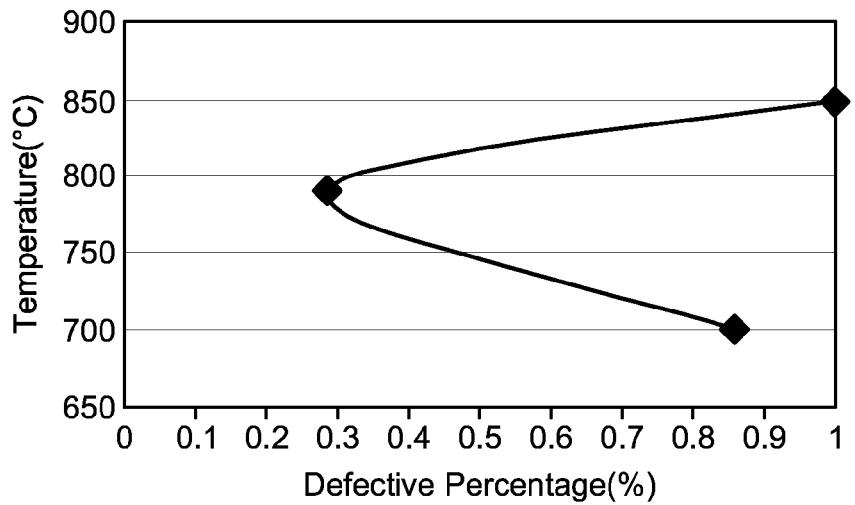
FIG. 5 illustrates the relationship of temperature of a pre-bake process vs. defective percentage of an epitaxial buffer layer of a semiconductor structure according to an embodiment of the present disclosure.

FIG. 5 illustrates the relationship of temperature of a pre-bake process vs. defective percentage of an epitaxial buffer layer of a semiconductor structure according to an embodiment of the present disclosure. In the examples as shown in FIG. 5, before the epitaxial buffer layers are formed in the recesses, the deposition surfaces of the recesses are chemically cleaned with the first etching solution, the second etching solution, and the etching gas, without being treated with hydrofluoric (HF) acid, followed by the pre-bake process performed under a pressure of 150 torr and at temperatures of 700° C., 790° C., and 850° C., respectively.

As shown in FIG. 5, when the pre-bake processes are performed under 150 torr and at 700° C. and 850° C., respectively, the measured defective percentages of the epitaxial buffer layers are about 0.8% and 1%, respectively. In contrast, when the pre-bake process is performed under 150 torr and at 790° C., the measured defective percentage of the epitaxial buffer layer is greatly reduced to below 0.3%. The C-shaped curve as shown in FIG. 5 clearly shows the preferred processing window for making low-defective epitaxial buffer layers. That is, when the pre-bake process is performed under the combination of the specific numerical ranges of temperature and pressure as illustrated in FIG. 5, the measured defective percentage of the epitaxial buffer layer may be largely reduced, for example, by 55-70%.

Figure 6:
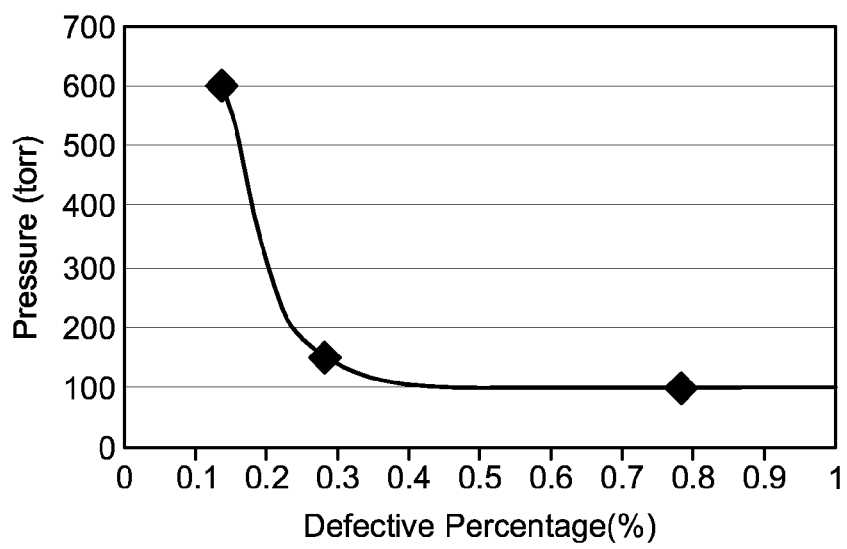
FIG. 6 illustrates the relationship of pressure of a pre-bake process vs. defective percentage of an epitaxial buffer layer of a semiconductor structure according to an embodiment of the present disclosure.

FIG. 6 illustrates the relationship of pressure of a pre-bake process vs. defective percentage of an epitaxial buffer layer of a semiconductor structure according to an embodiment of the present disclosure. In the examples as shown in FIG. 6, before the epitaxial buffer layers are formed in the recesses, the deposition surfaces of the recesses are chemically cleaned with the first etching solution, the second etching solution, and the etching gas, without being treated with hydrofluoric (HF) acid, followed by the pre-bake process performed at a temperature of 790° C. and under pressures of 100 torr, 150 torr, and 600 torr, respectively.

As shown in FIG. 6, when the pre-bake process is performed at 790° C. and under 100 torr, the measured defective percentage of the epitaxial buffer layer is about 0.8%. In contrast, when the pre-bake process is performed at 790° C. and under 150 torr, the measured defective percentage of the epitaxial buffer layer is greatly reduced to below 0.3%. Furthermore, when the pre-bake process is performed at 790° C. and under 600 torr, the measured defective percentage of the epitaxial buffer layer is greatly reduced to even below 0.15%. The curve as shown in FIG. 6 clearly shows the preferred processing window for making low-defective epitaxial buffer layers. That is, when the pre-bake process is performed under the combination of the specific numerical ranges of temperature and pressure as illustrated in FIG. 6, the measured defective percentage of the epitaxial buffer layer may be largely reduced, for example, by 55-80%.

In summary, as presented in the examples shown in FIGS. 5-6, within the processing window of the pre-bake temperature of about 740-840° C. and the pre-bake pressure of equal to or higher than 150 torr, even when hydrofluoric (HF) acid is not used for treating the deposition surface of the recess, the native oxides on the deposition surface of the recess can still be effectively removed by the pre-bake process having the specific processing window, and thus a low-defective epitaxial buffer layer can be formed in the recess. Moreover, without applying hydrofluoric (HF) acid in the recess of the substrate, damages caused by hydrofluoric (HF) acid to the semiconductor structure can be effectively prevented, the morphology of the recess as well as the gate structure can remain intact, and thus the performance of the semiconductor structure can be further improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a semiconductor structure, comprising:
    providing a substrate;
    forming a gate structure on the substrate;
    forming a recess in the substrate at a lateral side of the gate structure;
    chemically cleaning a deposition surface of the recess;
    performing a pre-bake process at a temperature of 790° C. and under a pressure of 600 torr, wherein chemically cleaning the deposition surface of the recess is free from treating the deposition surface of the recess with hydrofluoric (HF) acid, and chemically cleaning the deposition surface of the recess is before performing the pre-bake process; and
    forming an epitaxial buffer layer in the recess, wherein the epitaxial buffer layer is formed of SiP.

2. The manufacturing method of the semiconductor structure according to claim 1, wherein the pre-bake process is performed for 30-300 seconds.

3. The manufacturing method of the semiconductor structure according to claim 1, wherein the pre-bake process is performed with a pure hydrogen ($H_2$) atmosphere.

4. The manufacturing method of the semiconductor structure according to claim 1, wherein the epitaxial buffer layer has a thickness of 70-80 Å.

5. The manufacturing method of the semiconductor structure according to claim 1, further comprising:
    forming an epitaxial layer on the epitaxial buffer layer for filling up the recess.

6. The manufacturing method of the semiconductor structure according to claim 1, wherein chemically cleaning the deposition surface of the recess comprises:
    treating the deposition surface of the recess with a first etching solution, the first etching solution comprising a mixture of sulfonic acid ($H_2SO_4$) and hydrogen peroxide ($H_2O_2$).

7. The manufacturing method of the semiconductor structure according to claim 1, wherein chemically cleaning the deposition surface of the recess further comprises:
    treating the deposition surface of the recess with a second etching solution, the second etching solution comprising a mixture of ammonium hydroxide ($NH_4OH$), hydrogen peroxide ($H_2O_2$), and water ($H_2O$).

8. The manufacturing method of the semiconductor structure according to claim 1, wherein chemically cleaning the deposition surface of the recess further comprises:
    treating the deposition surface of the recess with an etching gas, the etching gas comprising a mixture of ammonia ($NH_3$) and nitrogen trifluoride ($NF_3$).

9. The manufacturing method of the semiconductor structure according to claim 1, wherein forming the gate structure on the substrate further comprises:
    forming a gate conductive layer on the substrate;
    forming a gate dielectric layer between the substrate and the gate conductive layer; and
    forming a spacer on sidewalls around the gate conductive layer.

* * * * *